United States Patent

Saneinejad et al.

[11] Patent Number: 5,734,556
[45] Date of Patent: Mar. 31, 1998

[54] MECHANICAL HEAT SINK ATTACHMENT HAVING TWO PIN HEADERS AND A SPRING CLIP

[75] Inventors: Mohsen Saneinejad, Sunnyvale; Hassan Siahpolo, Campbell, both of Calif.

[73] Assignee: Sun Microsystems, Inc., Mountain View, Calif.

[21] Appl. No.: 670,663

[22] Filed: Jun. 26, 1996

[51] Int. Cl.⁶ .................................. H05K 7/20
[52] U.S. Cl. .................. 361/719; 24/598.1; 24/626; 248/510; 257/719; 361/704
[58] Field of Search ............... 24/296, 457, 458, 24/570, 573.1, 533, 534, 598.1, 598.2, 625, 626; 411/352, 516, 530; 174/16.3; 165/80.3, 185; 248/316.7, 500, 505–510; 267/150, 158, 160; 257/706, 707, 713, 718, 719, 727; 361/690, 703, 704, 722, 717–719

[56] References Cited

U.S. PATENT DOCUMENTS

| | | | |
|---|---|---|---|
| 3,946,276 | 3/1976 | Braun | 361/704 |
| 4,679,118 | 7/1987 | Johnson | 361/386 |
| 4,716,494 | 12/1987 | Bright | 165/80.3 |
| 5,371,652 | 12/1994 | Clemens | 361/704 |
| 5,521,439 | 5/1996 | Casati | 257/718 |
| 5,581,442 | 12/1996 | Morosas | 361/704 |
| 5,640,305 | 6/1997 | Smithers | 361/719 |

Primary Examiner—Gerald P. Tolin
Attorney, Agent, or Firm—Blakely Sokoloff Taylor & Zafman

[57] ABSTRACT

An assembly for clamping a heat sink to an integrated circuit package that is mounted to printed circuit board. The assembly includes a pair of pin headers that are mounted to the printed circuit board. The assembly also contains a clip that is snapped onto the pin headers and presses the heat sink into the package. The pin headers each have a pair of posts that extend from a spacer. The posts are soldered to the printed circuit board to secure the headers to the board. The headers also have wire loops that extend from the spacers and capture the ends of the clip.

6 Claims, 1 Drawing Sheet

MECHANICAL HEAT SINK ATTACHMENT HAVING TWO PIN HEADERS AND A SPRING CLIP

BACKGROUND OF THE INVENTION

1. Field of the Invention

The present invention relates to an assembly for attaching a heat sink to an integrated circuit package.

2. Description of Related Art

Integrated circuits are typically housed within a plastic or ceramic package. The package has a plurality of external leads or solder balls that are mounted to a printed circuit board. The integrated circuits generate heat which must be removed from the package. Some integrated circuit packages incorporate heat slugs that minimize the thermal impedance of the package and maintain the junction temperature of the integrated circuits below a critical value. To further improve the thermal efficiency of the package, some integrated circuit packages contain a heat sink that is mounted to the heat slug. The heat sink provides a large effective surface area which increases the rate of heat transfer from the package.

The package assembly must incorporate means to fasten the heat sink to the package. An adhesive is undesirable because adhesive material typically "outgasses" undesirable constituents. Additionally, adhesives require process steps which increase the cost of assembling the packages. Adhesives also complicate any re-work of the package. It would therefore be desirable to provide an assembly that can readily clamp a heat sink to a package without using an adhesive.

SUMMARY OF THE INVENTION

The present invention is an assembly for clamping a heat sink to an integrated circuit package that is mounted to printed circuit board. The assembly includes a pair of pin headers that are mounted to the printed circuit board. The assembly also contains a clip that is snapped onto the pin headers and presses the heat sink into the package. The pin headers each have a pair of posts that extend from a spacer. The posts are soldered to the printed circuit board to secure the headers to the board. The headers also have wire loops that extend from the spacers and capture the ends of the clip.

BRIEF DESCRIPTION OF THE DRAWINGS

The objects and advantages of the present invention will become more readily apparent to those ordinarily skilled in the art after reviewing the following detailed description and accompanying drawings, wherein.

DETAILED DESCRIPTION OF THE INVENTION

Figure 1:
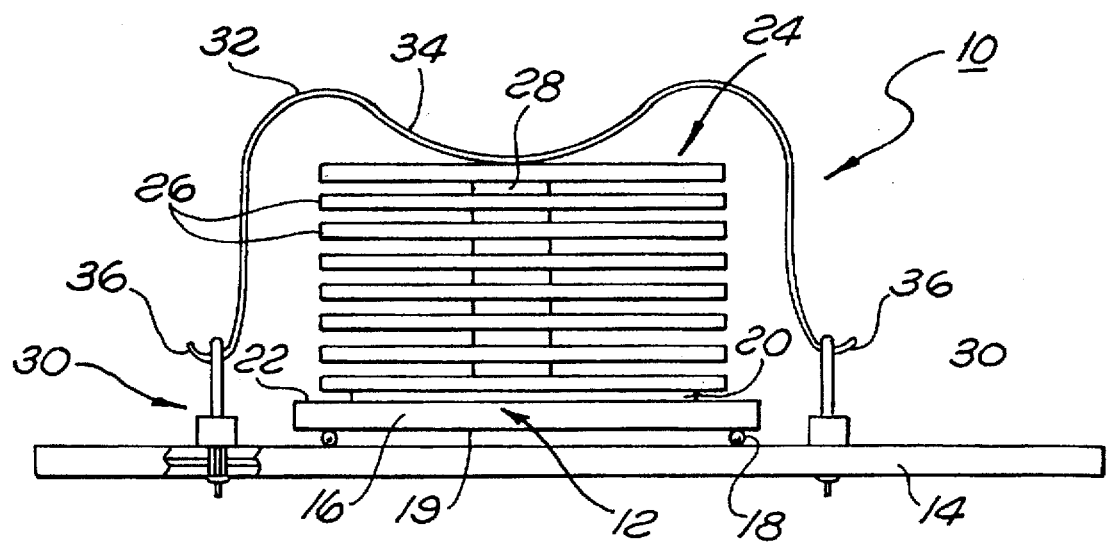
FIG. 1 is a side view of an integrated circuit package assembly of the present invention.

Referring to the drawings more particularly by reference numbers, FIG. 1 shows an integrated circuit package assembly 10 of the present invention. The assembly 10 includes an integrated circuit package 12 that is mounted to a printed circuit board 14. The integrated circuit package 12 typically contains an integrated circuit (not shown) enclosed by an outer package shell 16. The outer shell 16 is typically constructed from a plastic or ceramic material. The package 12 has a plurality of contacts 18 that extend from the bottom surface 19 of the outer shell 16. The contacts 18 are typically solder bails. Although solder balls are shown and described, it is to be understood that the contacts 18 may be pins or any other means for interconnecting the package 12 to the circuit board 14.

The package 12 preferably contains a heat slug 20 that extends from the top surface 22 of the outer shell 16. The heat slug 20 is typically constructed from a thermally conductive material such as copper or aluminum to improve the thermal efficiency of the package 12.

Mounted to the heat slug 20 is a heat sink 24. The heat sink 24 is preferably constructed from a thermally conductive material which has a plurality of fins 26 that extend from a center core 28. The fins 26 increase the effective area of the heat sink 24 and the rate of heat transfer from the package 12. The large heat transfer rate minimizes the temperature differential between the integrated circuit and the ambient of the package 12.

The assembly 10 has a pair of pin headers 30 that are mounted to the printed circuit board 14. The assembly 10 also has a clip 32 that is attached to the pin headers 30 to press the heat sink 24 into the heat slug 20 of the package 12. The clip 32 preferably contains a wavy portion 34 that will exert a large enough spring force to minimize the air gap and thermal impedance at the interface between the heat sink 24 and the heat slug 20. The wavy portion 34 also compensates for variations in the height of the heat sink 24 and the package 12. The clip 32 has a pair of lip portions 36 that can be easily snapped onto the pin headers 30. The clip 32 can be detached from the headers 30 by deflecting the lips 36 toward the circuit board 14.

Figure 2:
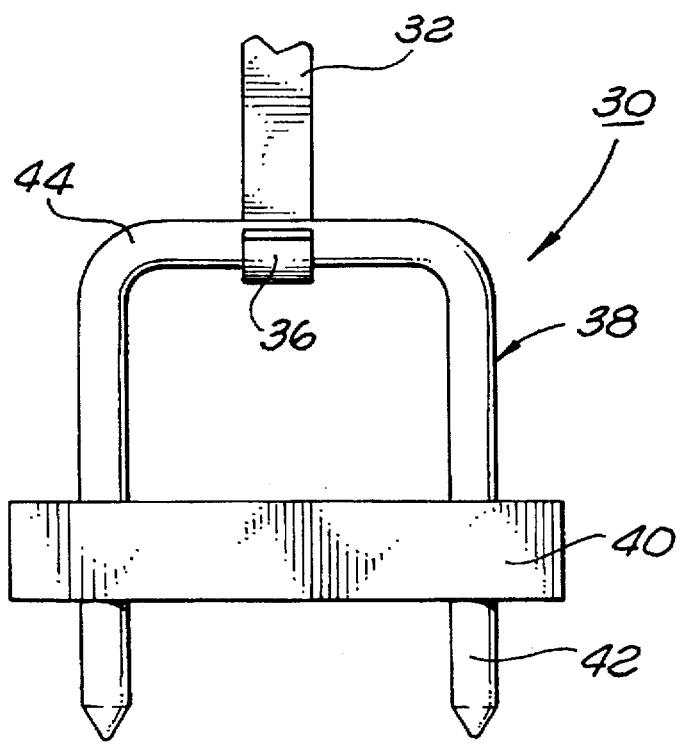
FIG. 2 is a side view of a pin header of the assembly shown in FIG. 1.

FIG. 2 shows a preferred embodiment of a pin header 30. Each header 30 has a wire 38 that is bent into a U-shape. A spacer 40 is attached to the U-shaped wire 38 to create a pair of wire posts 42 that extend from one side of the spacer 40 and a wire loop 44 which extends from an opposite side of the spacer 40. The lip portions 36 of the clip 32 are inserted into the wire loops 44 to attach the clip 32 to the headers 30.

The posts 42 are preferably soldered to plated through holes formed in the printed circuit board 14. The posts 42 are typically covered with a layer of solder before insertion into the plated through holes so that the headers 30 can be attached to the printed circuit board 14 with a wave solder process. The spacer 40 of each header 30 maintains the wire loop 44 above the surface of the board 14 during the solder process.

In the preferred embodiment, the posts 42 are connected to a ground plane of the printed circuit board to electrically ground the clip 32. The electrically grounded clip 32 provides an electromagnetic shield for the package 12. The spacer 40 is typically constructed from a molded plastic material that can be easily assembled to the U-shaped wire 38. The spacer 40 may be molded onto the wire 38, pressed onto the wire 38 or otherwise attached by any means.

In operation, the headers 30 are mounted to the printed circuit board 14 by soldering the posts 42 to the plated through holes of the board 14. The integrated circuit package 12 is also soldered to the printed circuit board 14. The heat sink 24 and clip 32 are then placed on top of the package 12. The lip portions 36 are deflected to attach the clip 32 to the headers 30 and press the heat sink 24 into the heat slug 20. The heat sink 24 can be removed by merely deflecting the lip portions 36 and detaching the clip 32 from the pin headers 30. The present invention provides a package assembly that allows a heat sink to be readily mounted and detached from a package without using any adhesives.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An integrated circuit package assembly, comprising:
   a printed circuit board;
   a pair of pin headers mounted to and electrically coupled to said printed circuit board;
   an integrated circuit package mounted to said printed circuit board;
   a heat sink located on said integrated circuit package; and,
   a clip that is attached to said pin headers and which presses said heat sink into said integrated circuit package, said clip also electrically couples said heat sink to said pin headers and said printed circuit board.

2. The assembly as recited in claim 1, wherein said pin headers each have a spacer that has a first side and an opposite second side, a post that extends from said first side of said spacer and is attached to said printed circuit board, and a wire loop that extends from said second side of said spacer, said wire loop having an opening that receives said clip.

3. The assembly as recited in claim 2, wherein said clip has a pair of lips that snap onto said wire loops of said pin headers.

4. The assembly as recited in claim 3, wherein said spacer of each pin header is a molded plastic material, and each wire loop has a U-shape.

5. The assembly as recited in claim 1, wherein said heat sink is pressed onto a heat slug of said integrated circuit package.

6. A method for clamping a heat sink to an integrated circuit package, comprising the steps of:

a) providing a printed circuit board that has an integrated circuit package and a pair of pin headers extending from a top surface of said printed circuit board, wherein said pin headers are electrically coupled to said printed circuit board;

b) placing a heat sink onto the integrated circuit package, c) placing a clip onto said heat sink; and, d) attaching said clip to said pin headers to press said heat sink into said integrated circuit package and electrically coupling said heat sink to said pin headers and said printed circuit board.

* * * * *